US012642053B2

(12) United States Patent
Jeong et al.

(10) Patent No.: US 12,642,053 B2
(45) Date of Patent: May 26, 2026

(54) APPARATUS FOR LIFTING SUBSTRATE AND APPARATUS FOR PROCESSING SUBSTRATE

(71) Applicant: SEMES CO., LTD., Chungcheongnam-do (KR)

(72) Inventors: Wan Hee Jeong, Gyeonggi-do (KR); Kuk Saeng Kim, Gyeonggi-do (KR); Jun Hyeak Choi, Seoul (KR)

(73) Assignee: SEMES CO., LTD., Chungcheongnam-do (KR)

( * ) Notice: Subject to any disclaimer, the term of this patent is extended or adjusted under 35 U.S.C. 154(b) by 860 days.

(21) Appl. No.: 17/747,901

(22) Filed: May 18, 2022

(65) Prior Publication Data

US 2023/0124884 A1      Apr. 20, 2023

(30) Foreign Application Priority Data

Oct. 15, 2021     (KR) ........................ 10-2021-0137370

(51) Int. Cl.
*H01L 21/68* (2006.01)
*H01L 21/687* (2006.01)

(52) U.S. Cl.
CPC .. *H01L 21/68742* (2013.01); *H01L 21/68785* (2013.01)

(58) Field of Classification Search
CPC ................................................ H01L 21/68742
See application file for complete search history.

(56) References Cited

U.S. PATENT DOCUMENTS 7,923,280 B2 *  4/2011  Koelmel .......... H01L 21/68742
                                                                438/57
8,113,918 B2    2/2012  Koo et al.
                (Continued)

FOREIGN PATENT DOCUMENTS

CN          112542419        3/2021
JP          2010-12591       1/2010
                (Continued)

OTHER PUBLICATIONS

Office Action dated May 23, 2023 for Japanese Patent Application No. 2022-087362 and its English translation provided by Global Dossier.

(Continued)

*Primary Examiner* — Ronald P Jarrett
(74) *Attorney, Agent, or Firm* — WOMBLE BOND DICKINSON (US) LLP

(57)     ABSTRACT
A substrate lifting apparatus and a substrate processing apparatus for reducing deformation due to heat are provided. The substrate lifting apparatus comprises a plurality of pins in contact with a substrate, an upper plate for supporting the plurality of pins and having a plurality of upper connecting portions formed on a lower surface, a lower plate having a plurality of lower connecting portions connected to the plurality of upper connecting portions formed on an upper surface and disposed under the upper plate, and a driving unit for driving the plurality of pins to move up and down, wherein the lower plate supports a plurality of bushes and a plurality of shafts passing through the plurality of bushes on an upper surface thereof.

18 Claims, 13 Drawing Sheets

10

(56)                References Cited

U.S. PATENT DOCUMENTS

| | | | | |
|---|---|---|---|---|
| 8,268,087 B2 * | 9/2012 | Kamikawa | ........ | H01L 21/67051 |
| | | | | 134/147 |
| 11,302,565 B2 | 4/2022 | Moos et al. | | |
| 12,083,563 B2 | 9/2024 | Nakazawa et al. | | |
| 2011/0048469 A1 * | 3/2011 | Ogata | ............... | H01L 21/67051 |
| | | | | 134/33 |
| 2017/0352565 A1 * | 12/2017 | Zhang | ................. | C23C 16/4587 |
| 2019/0311941 A1 * | 10/2019 | Moos | ............... | H01L 21/68742 |

FOREIGN PATENT DOCUMENTS

| | | |
|---|---|---|
| KR | 10-2011-0031747 | 3/2011 |
| KR | 10-2011-0075585 | 7/2011 |
| KR | 10-2013-0012393 | 2/2013 |
| KR | 10-1445911 | 9/2014 |
| KR | 10-2015-0111971 | 10/2015 |
| KR | 10-2020-0098712 | 8/2020 |
| KR | 10-2021-0116003 | 9/2021 |
| WO | 2009/084406 | 7/2009 |

OTHER PUBLICATIONS

Notice of Allowance dated Oct. 13, 2025 for Korean Patent Application No. 10-2021-0137370 and its English translation from Global Dossier.
Office Action (1st) dated Nov. 26, 2025 for Chinese Patent Application No. 202210846636.2 and its English translation by Google Translate.

* cited by examiner

APPARATUS FOR LIFTING SUBSTRATE AND APPARATUS FOR PROCESSING SUBSTRATE

This application claims the benefit of Korean Patent Application No. 10-2021-0137370, filed on Oct. 15, 2021, in the Korean Intellectual Property Office, the disclosure of which is incorporated herein by reference in its entirety.

BACKGROUND

1. Field

The present disclosure relates to a substrate lifting apparatus and a substrate processing apparatus.

2. Description of the Related Art

In general, in the process of manufacturing a semiconductor device, a semiconductor substrate undergoes several steps, such as a deposition process of a material layer, a process of etching the deposited material layer, a cleaning process, and a drying process. These processes are performed in a process chamber, which is a semiconductor manufacturing device.

The process chamber is a reaction vessel having a sealed reaction region therein, and a chuck is installed to fix the semiconductor substrate seated therein. At this time, the chuck can be divided into a vacuum chuck using a vacuum or an electrostatic chuck using an electrostatic force depending on the gripping method of the substrate. Recently, the electrostatic chuck is mainly used.

The substrate is transferred into or out of the process chamber by the substrate transfer device. The substrate is transferred while the substrate is raised to be spaced apart from the electrostatic chuck. To this end, the electrostatic chuck is provided with a substrate lifting apparatus for raising or lowering the substrate from the electrostatic chuck.

SUMMARY

An object of the present disclosure is to provide a substrate lifting apparatus that reduces deformation due to heat.

Another object of the present disclosure is to provide a substrate processing apparatus using a substrate lifting apparatus that reduces deformation due to heat.

The objects of the present disclosure are not limited to the objects mentioned above, and other objects not mentioned will be clearly understood by those skilled in the art from the following description.

One aspect of the substrate lifting apparatus according to the present disclosure for achieving the above technical object comprises a plurality of pins in contact with a substrate, an upper plate for supporting the plurality of pins and having a plurality of upper connecting portions formed on a lower surface, a lower plate having a plurality of lower connecting portions connected to the plurality of upper connecting portions formed on an upper surface and disposed under the upper plate, and a driving unit for driving the plurality of pins to move up and down, wherein the lower plate supports a plurality of bushes and a plurality of shafts passing through the plurality of bushes on an upper surface thereof.

Wherein a thermal expansion coefficient of the upper plate is lower than a thermal expansion coefficient of the lower plate.

Wherein the upper plate includes an upper magnet on the lower surface, and the lower plate includes a lower magnet aligned with the upper magnet on the upper surface.

Wherein the plurality of upper connecting portions and the plurality of lower connecting portions are kinematically coupled.

Wherein the plurality of upper connecting portions have a convex shape toward the lower plate, and at least one of the plurality of lower connecting portions includes a groove, into which the upper connecting portion is inserted, and extending in a direction extending from a center of the lower plate and the plurality of lower connecting portions.

Wherein the plurality of upper connecting portions, the plurality of lower connecting portions, and the plurality of pins are each three.

Wherein, a hole, through which a circuit passes, is formed in the upper plate and a central portion of the lower plate.

Another aspect of the substrate lifting apparatus according to the present disclosure for achieving the above technical object comprises an upper plate including a plurality of upper connecting portions disposed on a lower surface, a plurality of pins disposed on an upper surface of the upper plate, and a lower plate disposed under the upper plate, wherein the lower plate comprises a plurality of lower connecting portions disposed on an upper surface of the lower plate and connected to the plurality of upper connecting portions, a plurality of bushes disposed on an upper surface of the lower plate and disposed outside the plurality of pins with respect to a center of the lower plate, and a plurality of shafts passing through the plurality of bushes, wherein the plurality of upper connecting portions include a convex protrusion toward the plurality of lower connecting portions, wherein the plurality of lower connecting portions include grooves for guiding a movement direction of the protrusion of the plurality of lower connecting portions.

Wherein the upper plate includes an upper magnet on the lower surface, the lower plate includes a lower magnet aligned with the upper magnet on the upper surface, and an attractive force acts between the upper magnet and the lower magnet.

The apparatus further comprises a driving unit for driving the plurality of pins to move up and down.

Wherein a thermal expansion coefficient of the upper plate is lower than a thermal expansion coefficient of the lower plate.

Wherein each of the plurality of upper connecting portions, the plurality of lower connecting portions, and the plurality of pins are symmetrical with respect to a center of the lower plate.

Wherein the groove extends in a first direction along an extension line connecting a center of the lower plate and the plurality of lower connecting portions, and has a width in a second direction perpendicular to the first direction, and the protrusion is guided in the first direction and fixed in the second direction.

One aspect of the substrate processing apparatus according to the present disclosure for achieving the above technical object comprises a process chamber defining an inner space, a substrate support unit installed in the inner space and for supporting a substrate; and a substrate lifting unit for moving the substrate up and down, wherein the substrate lifting unit comprises a plurality of pins passing through the substrate support unit and in contact with the substrate, an upper plate for supporting the plurality of pins and having a plurality of upper connecting portions formed on a lower surface, a lower plate having a plurality of lower connecting portions connected to the plurality of upper connecting portions formed on an upper surface and disposed under the upper plate, and a driving unit for driving the plurality of pins to move up and down, wherein the lower plate supports a plurality of bushes and a plurality of shafts passing through the plurality of bushes on an upper surface thereof.

Wherein the plurality of upper connecting portions have a downwardly convex shape toward the lower plate, and at least one of the plurality of lower connecting portions includes a groove, into which the plurality of upper connecting portions are inserted.

Wherein the groove extends in a first direction connecting a center of the lower plate and the plurality of lower connecting portions on the plurality of lower connecting portions, and the plurality of upper connecting portions, in response to connecting to the plurality of lower connecting portions, are guided in the first direction and engaged in a second direction different from the first direction.

Wherein the substrate lifting unit further comprises a bellows in contact with an outer wall of the process chamber and through which the plurality of pins pass.

Wherein the upper plate includes an upper magnet on the lower surface, and the lower plate includes a lower magnet aligned with the upper magnet on the upper surface.

Wherein the plurality of upper connecting portions and the plurality of lower connecting portions overlap the plurality of pins.

Wherein a thermal expansion coefficient of the upper plate is lower than a thermal expansion coefficient of the lower plate.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
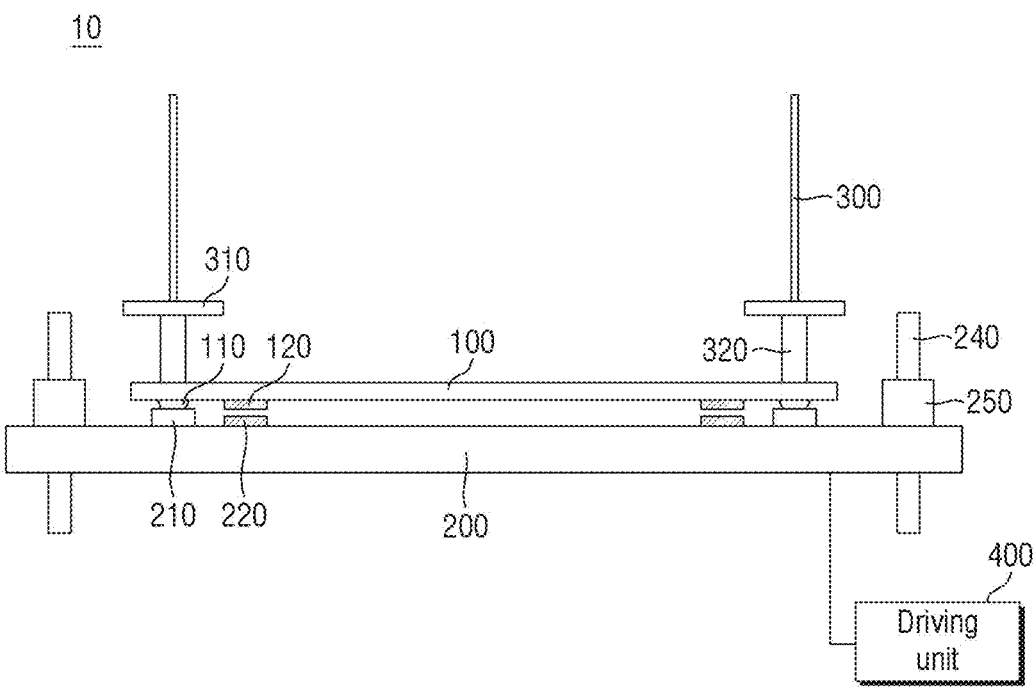
FIG. 1 is a conceptual diagram for describing a substrate lifting apparatus according to an embodiment of the present disclosure.

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings. However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

When an element or layer is referred as being located "on" another element or layer, it includes not only being located directly on the other element or layer, but also with intervening other layers or elements. On the other hand, when an element is referred as being "directly on" or "immediately on," it indicates that no intervening element or layer is interposed.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present disclosure.

The terminology used herein is for the purpose of describing the embodiments and is not intended to limit the present disclosure. In the present disclosure, the singular also includes the plural, unless specifically stated otherwise in the phrase. As used herein, "comprises" and/or "comprising" refers to that components, steps, operations and/or elements mentioned does not exclude the presence or addition of one or more other components, steps, operations and/or elements.

Unless otherwise defined, all terms (including technical and scientific terms) used herein may be used with the meaning commonly understood by those of ordinary skill in the art to which the present disclosure belongs. In addition, terms defined in a commonly used dictionary are not to be interpreted ideally or excessively unless clearly defined in particular.

Hereinafter, embodiments of the present disclosure will be described in detail with reference to the accompanying drawings, and in the description with reference to the accompanying drawings, the same or corresponding components are given the same reference numbers, regardless of reference numerals in drawings, and an overlapped description therewith will be omitted.

Figure 2:
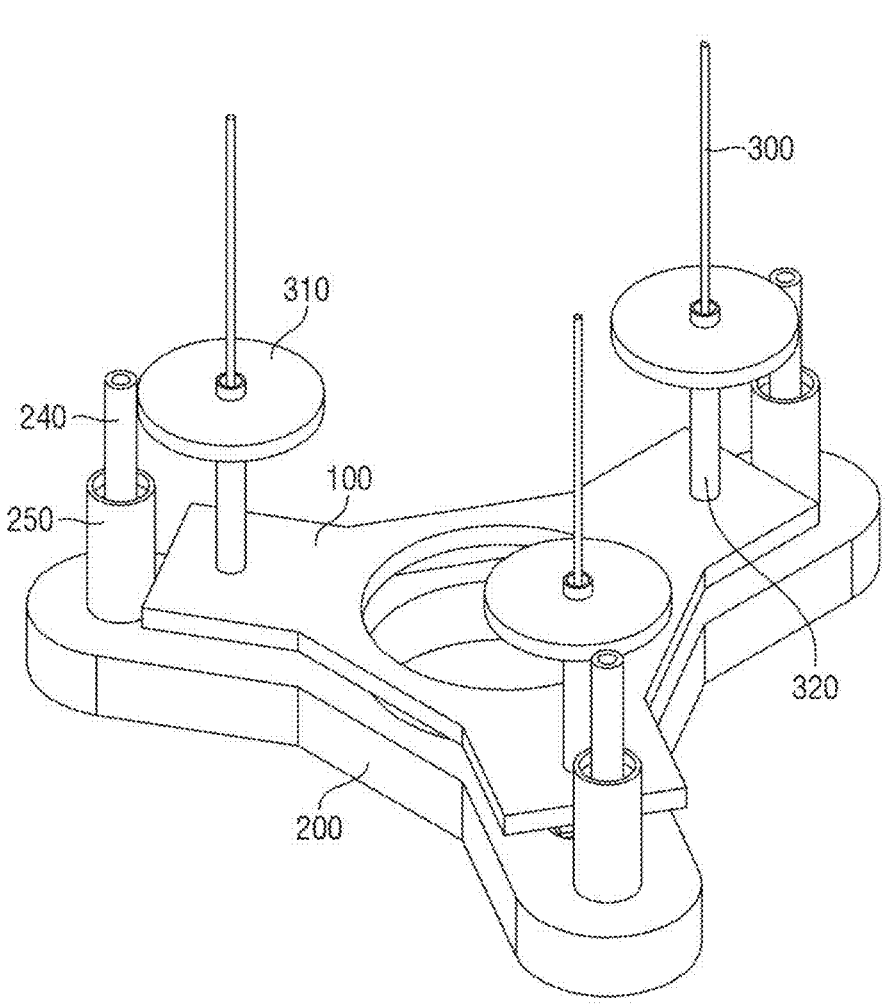
FIG. 2 is a diagram illustrating a substrate lifting apparatus according to an embodiment of the present disclosure.
Figure 3:
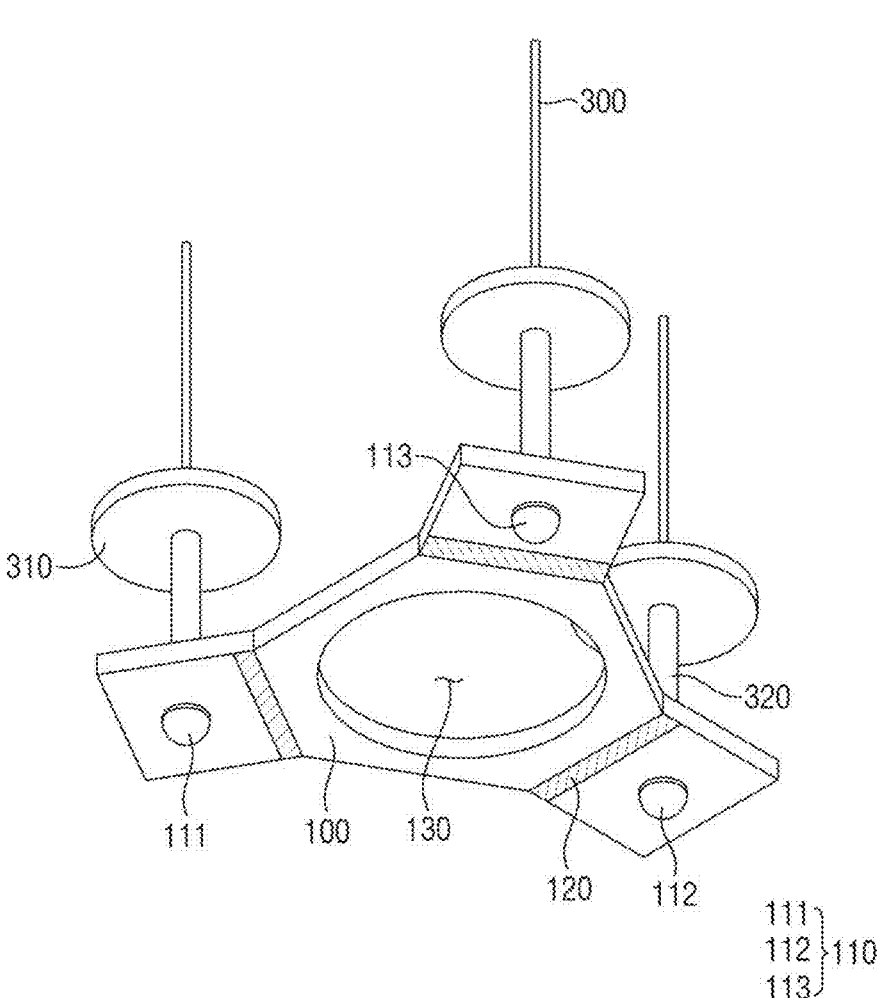
FIG. 3 is a view illustrating an upper plate of a substrate lifting apparatus according to an embodiment of the present disclosure.
Figure 4:
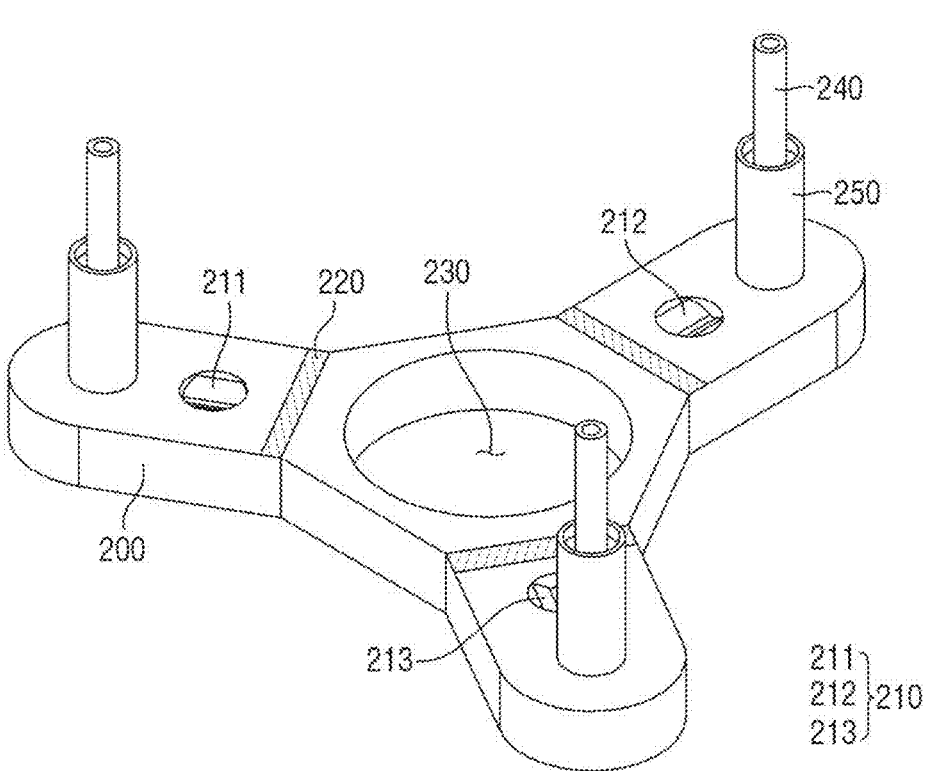
FIG. 4 is a view showing a lower plate of the substrate lifting apparatus according to an embodiment of the present disclosure.

FIG. 1 is a conceptual diagram for describing a substrate lifting apparatus according to an embodiment of the present disclosure. FIG. 2 is a view showing a substrate lifting apparatus according to an embodiment of the present disclosure. FIG. 3 is a view illustrating an upper plate of a substrate lifting apparatus according to an embodiment of the present disclosure. FIG. 4 is a view showing a lower plate of the substrate lifting apparatus according to an embodiment of the present disclosure.

Referring to FIGS. 1 to 4, the substrate lifting apparatus 10 includes an upper plate 100, a lower plate 200, a lift pin 300, and a driving unit 400.

The upper plate 100 may support the lift pin 300. The upper plate 100 may contact the lower end of the lift pin 300.

The upper plate 100 may include an upper central hole 130. The upper central hole 130 may be provided to install a circuit for driving the substrate lifting apparatus 10. The upper plate 100 may include a symmetrical structure with respect to the upper central hole 130.

The upper plate 100 includes an upper connecting portion 110 and an upper magnet 120 on a lower surface. The upper plate 100 and the lower plate 200 may be spaced apart by the upper connecting portion 110 and the lower connecting portion 210. An area of the upper plate 100 may be smaller than an area of the lower plate 200. The upper plate 100 may overlap the lower plate 200. Specifically, the upper central hole 130 of the upper plate 100 and the lower central hole 230 of the lower plate 200 may overlap.

The upper connecting portion 110 may be installed on a lower surface of the upper plate 100. A plurality of upper connecting portions 110 may be disposed. For example, three upper connecting portions 110 may be disposed on the lower surface of the upper plate 100. In FIG. 3, the upper plate 100 is illustrated as including three upper connecting portions 110, but the embodiment is not limited thereto. As another example, the upper plate 100 may include only one upper connecting portion 110 on the lower surface. As another example, the upper plate 100 may include more than three upper connecting portions 110. For convenience of description, it will be described below as an example that three upper connecting portions 110 are disposed on the upper plate 100.

The upper connecting portion 110 may include a shape aligned with the lower connecting portion 210. Specifically, the upper connecting portion 110 may include a shape engaged with the lower connecting portion 210. The upper connecting portion 110 may be kinematically coupled to the lower connecting portion 210.

The upper connecting portion 110 may have a downwardly convex shape. The upper connecting portion 110 may include a downwardly convex protrusion. For example, the upper connecting portion 110 may include a hemispherical structure. In FIG. 3, the upper connecting portion 110 is illustrated as having a hemispherical shape, but the embodiment is not limited thereto. For example, the upper connecting portion 110 may include a shape of a downwardly convex hexahedron. For another example, the upper connecting portion 110 may further include a separate protrusion that is fitted into the inner wall of the lower connecting portion 210 in order to tighten the fastening.

The upper connecting portion 110 may overlap the lift pin 300 with the upper plate 100 interposed therebetween. However, the embodiment is not limited thereto. For example, the upper connecting portion 110 may be located closer to the upper central hole 130 than the lift pin 300. That is, the upper connecting portion 110 may be located inside the upper plate 100 rather than the lift pin 300 when the upper plate 100 is viewed from the top.

Although the upper connecting portion 110 is illustrated as having the same shape in FIG. 3, the embodiment is not limited thereto. For example, the plurality of upper connecting portions 110 may have different shapes, respectively. The first upper connecting portion 111 may have a hemispherical shape, the second upper connecting portion 112 may have a hexahedral shape, and the third upper connecting portion 113 may have other shapes that are not standardized.

The upper magnet 120 may be installed on a lower surface of the upper plate 100. A plurality of upper magnets 120 may be disposed. For example, three upper magnets 120 may be disposed on the lower surface of the upper plate 100. In FIG. 3, the upper plate 100 is illustrated as including three upper magnets 120, but the embodiment is not limited thereto. As another example, the upper plate 100 may include only one upper magnet 120 on its lower surface. As another example, the upper plate 100 may include more than three upper magnets 120. For convenience of description, it will be described below as an example that three upper magnets 120 are disposed on the upper plate 100.

The upper magnet 120 may be aligned with the lower magnet 220. Specifically, before the substrate lifting apparatus 10 expands due to heat, the upper magnet 120 may completely overlap the lower magnet 220.

The upper magnet 120 may be located inside rather than the upper connecting portion 110 and the lift pin 300 when the upper plate 100 is viewed from the top. That is, the upper magnet 120 may be located closer to the upper central hole 130 than the upper connecting portion 110 and the lift pin 300.

The lower plate 200 may support a bush 250. The lower plate 200 may contact the lower end of the bush 250. The bush 250 may be passed through by a shaft 240. The bush 250 may surround the shaft 240. The shaft 240 may pass through the lower plate 200 and the bush 250. The shaft 240 may be fixed, or may be movable up and down. The shaft 240 may serve as an axis for the bush 250 to move up and down. That is, the bush 250 may move up and down with respect to the shaft 240. As the bush 250 moves up and down with respect to the shaft 240 as an axis, the lower plate 200 may move up and down.

The lower plate 200 may include a lower central hole 230. The lower central hole 230 may be provided to install a circuit for driving the substrate lifting apparatus 10. The lower plate 200 may include a symmetrical structure with respect to the lower central hole 230.

The lower plate 200 includes a lower connecting portion 210 and a lower magnet 220 on the upper surface.

The lower connecting portion 210 may be installed on the upper surface of the lower plate 200. A plurality of lower connecting portions 210 may be disposed. For example, three lower connecting portions 210 may be disposed on the upper surface of the lower plate 200. In FIG. 4, the lower plate 200 is illustrated as including three lower connecting portions 210, but the embodiment is not limited thereto. As another example, the lower plate 200 may include only one lower connecting portion 210 on the upper surface. As another example, the lower plate 200 may include more than three lower connection portions 210. For convenience of description, it will be described as an example that three lower connecting portions 210 are disposed on the upper plate 100.

The lower connection portion 210 may be aligned with the upper connecting portion 110. The lower connecting portion 210 may correspond to the upper connecting portion 110 on a one-to-one basis. The lower connecting portion 210 may include a structure having a shape engaged with the upper connecting portion 110. The lower connecting portion 210 may be kinematically coupled to the upper connecting portion 110.

The lower connecting portion 210 may have a downwardly concave shape. Specifically, the lower connecting portion 210 may include a groove for accommodating the upper connecting portion 110. The groove of the lower connecting portion 210 may include a width and an extension direction limiting the movement direction of the upper connecting portion 110. This will be described in detail below with reference to FIGS. 5 to 8.

The lower connecting portion 210 may be located closer to the lower central hole 230 than the shaft 240 and the bush 250. That is, the lower connecting portion 210 may be located inside the lower plate 200 rather than the shaft 240 and the bush 250 when the lower plate 200 is viewed from the top.

The lower magnet 220 may be installed on the upper surface of the lower plate 200. A plurality of lower magnets 220 may be disposed. For example, three lower magnets 220 may be disposed on the upper surface of the lower plate 200. In FIG. 4, the lower plate 200 is illustrated as including three lower magnets 220, but the embodiment is not limited thereto. As another example, the lower plate 200 may include only one lower magnet 220 on the upper surface. As another example, the lower plate 200 may include more than three lower magnets 220. For convenience of description, it will be described below as an example that three upper magnets 220 are disposed on the lower plate 200.

The lower magnet 220 may be aligned with the upper magnet 120. An attractive force acts between the lower magnet 220 and the upper magnet 220, so that the upper plate 100 and the lower plate 200 may be stably aligned. Specifically, due to the upper connecting portion 110 and the lower connecting portion 210, it can prevent the upper plate 100 and the lower plate 200 that are not completely in close contact but spaced apart from each other from being twisted by the attractive force acting between the lower magnet 220 and the upper magnet 120.

The lift pin 300 may include a portion in direct contact with the substrate. The lift pins 300 may directly contact the substrate to move the substrate up and down.

The lift pins 300 may be installed on the upper surface of the upper plate 100. That is, the lift pins 300 may be supported by the upper plate 100. A plurality of lift pins 300 may be disposed on the upper surface of the upper plate 100.

The plurality of lift pins 300 may be disposed at an edge of the upper plate 100. The plurality of lift pins 300 may be disposed to be symmetrical with respect to the upper central hole 130 of the upper plate 100. That is, the plurality of lift pins 300 may be disposed at points each spaced apart from the upper central hole 130 by the same distance.

The lift pin 300 may be located on a line connecting the upper central hole 130 and the shaft 240 and the bush 250 disposed on the upper surface of the lower plate 200. That is, the lift pin 300, the shaft 240, and the bush 250 may be located on the same line from the upper central hole 130.

The lift pin 300 may be surrounded by the housing portion 320. The lift pin 300 may be connected to the bellows 310 and the housing portion 320. The lift pin 300 may pass through the bellows 310. The bellows 310 may have a disk shape. The bellows 310 may strengthen coupling with the chamber when the lift pin 300 passes through the chamber and contacts the substrate. The lower end of the housing portion 320 is in contact with the upper plate 100. The housing portion 320 may surround the lift pin 300. The lift pins 300 may pass through the bellows 310 from the inside of the housing portion 320 and extend in a direction perpendicular to the upper plate 100.

The driving unit 400 may drive the substrate lifting apparatus 10. Specifically, the driving unit 400 may drive the lift pin 300 to lift the substrate. The driving unit 400 may drive the bush 250 to be raised and lowered with respect to the shaft 240 as an axis.

Figure 5:
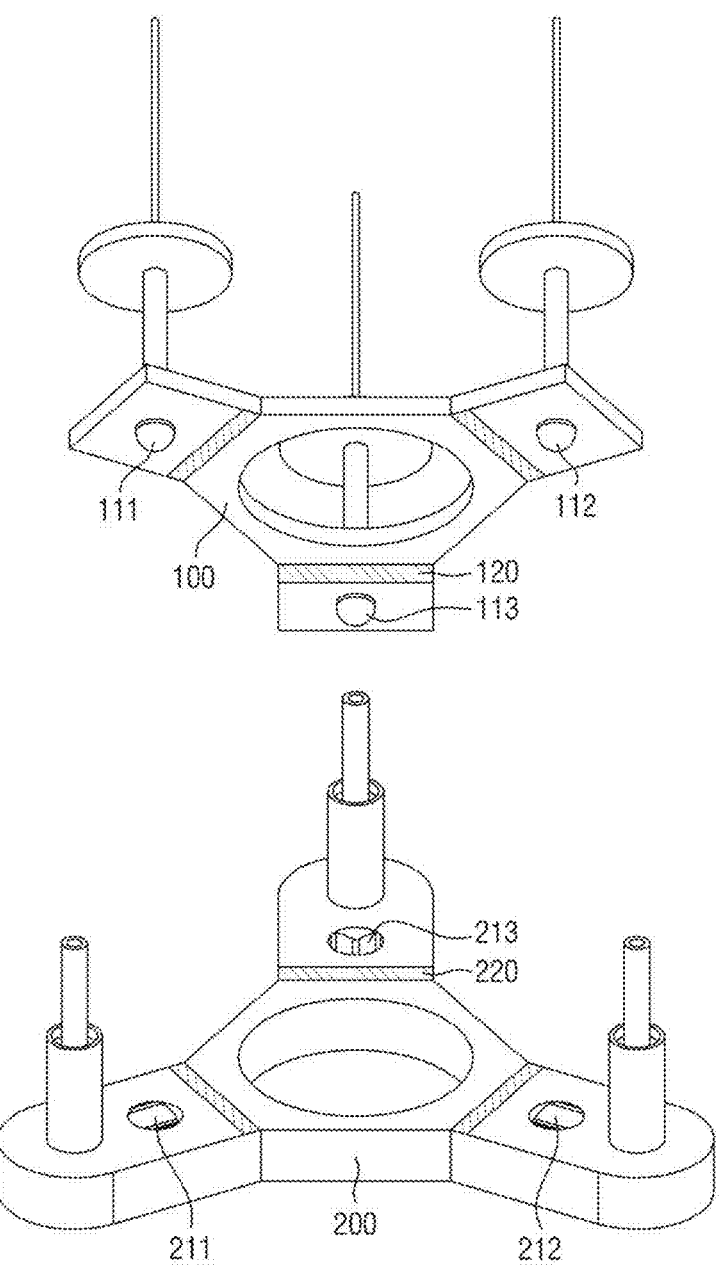
FIGS. 5 and 6 are views for describing an upper connecting portion and a lower connecting portion according to an embodiment of the present disclosure.
Figure 6:
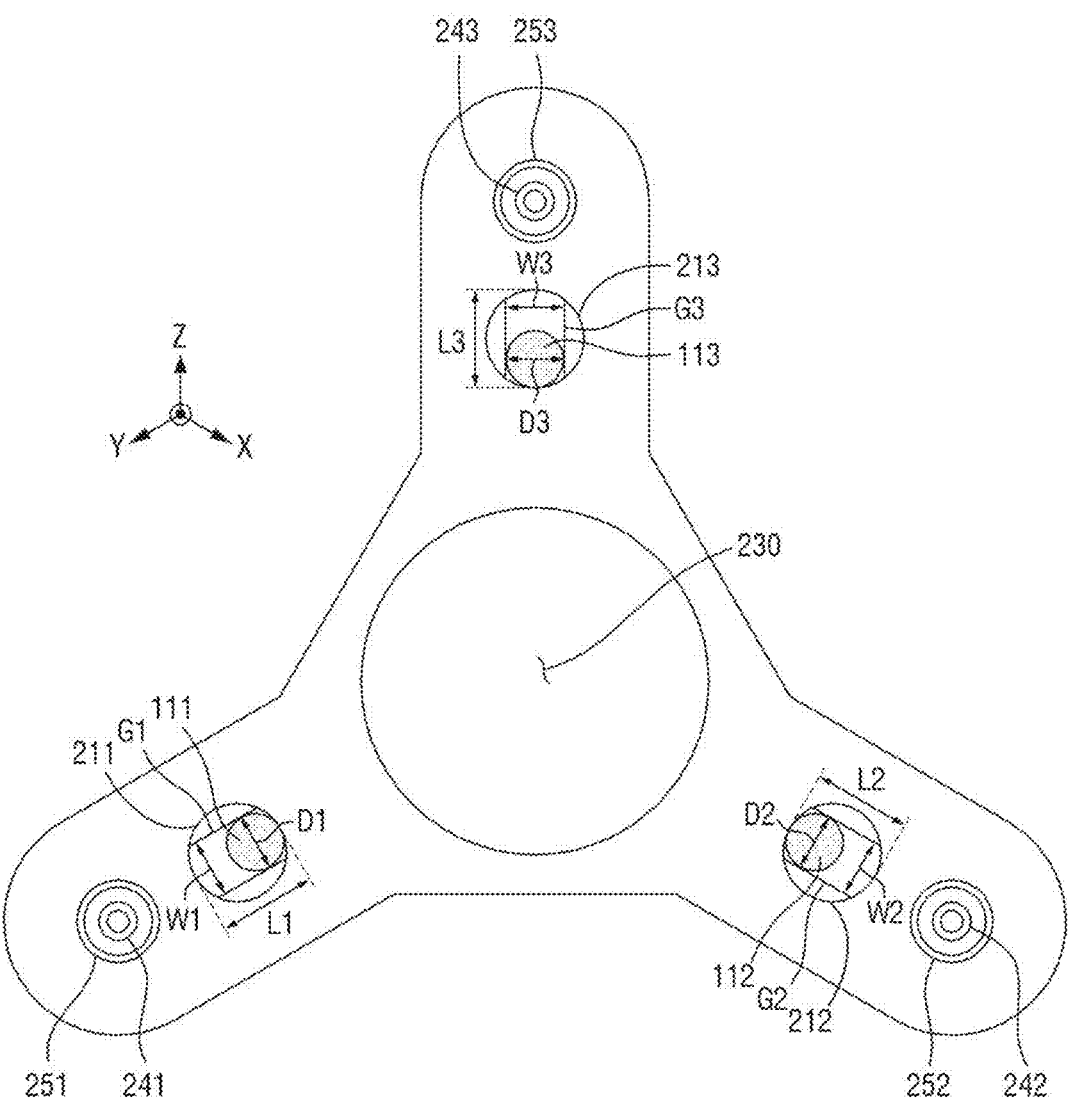

FIGS. 5 and 6 are views for describing an upper connecting portion and a lower connecting portion according to an embodiment of the present disclosure.

Referring to FIGS. 5 and 6, the first to third upper connecting portions 111-113 may have first to third diameters D1-D3, respectively. The cross-sectional areas of the first upper connecting portion to the third upper connecting portion 111-113 may be smaller than the cross-sectional areas of the first lower connecting portion to the third lower connecting portion 211-213.

The first upper connecting portion to the third upper connecting portion 111-113 may be respectively connected to the first lower connecting portion to the third lower connecting portion 211-213. The first upper connecting portion to the third upper connecting portion 111-113 may be fitted into the first to third grooves G1 to G3 of the first lower connecting portion to the third lower connecting portion 211-213, respectively.

The first to third lower connecting portions 211 to 213 may include first to third grooves G1 to G3, respectively. The first to third grooves G1 to G3 refer to recesses that are concave in a direction from the upper surface to the lower surface of the lower plate 200.

The first to third grooves G1 to G3 have first to third widths W1 to W3, respectively. The first to third widths W1 to W3 may be the same as the first to third diameters D1 to D3 of the first to third upper connecting portions 111-113. That is, the first upper connecting portion to the third upper connecting portion 111 to 113 connected to the first lower connecting portion to the third lower connecting portion 211 to 213 may be fixed in a direction of the first to the third width W1 to w3 of the first to third grooves G1 to G3.

The first to third grooves G1 to G3 may extend in the first to third lengths L1 to L3 in the first direction X, the second direction Y, and the third direction Z, respectively. In this case, the first direction X may refer to a direction of a straight line connecting the center point of the first shaft 241 and the first bush 251 from the center point of the lower central hole 230. The second direction Y may refer to a direction of a straight line connecting the center point of the second shaft 242 and the second bush 252 from the center point of the lower central hole 230. The third direction Z may refer to a direction of a straight line connecting the center point of the third shaft 243 and the third bush 253 from the center point of the lower central hole 230.

The first to third lengths L1 to L3 extending in the first direction X, the second direction Y, and the third direction Z of the first to third grooves G1 to G3 are larger, respectively, than the first to third diameters D1 to D3 of the first to third upper connecting portions 111-113 fitted in the first to third grooves G1 to G3. Accordingly, when the first upper connecting portion to the third upper connecting portion 111-113 are fitted into the first lower connecting portion to the third lower connecting portion 211-213, they may move in a first direction X, a second direction Y, and a third direction Z, in which the first to third grooves G1 to G3 of the first lower connecting portion to the third lower connecting portion 211-213 extend.

That is, the first upper connecting portion 111 to the third upper connecting portion 113 may be respectively connected to the first lower connecting portion 211 to the third lower connecting portion 213 and guided by the first to third grooves G1 to G3. When the first upper connection portion 111 is connected to the first lower connection portion 211, it may be guided in the first direction X, in which the first groove G1 extends. When the second upper connecting portion 112 is connected to the second lower connecting portion 212, it may be guided in the second direction Y, in which the second groove G2 extends. When the third upper connecting portion 113 is connected to the third lower connecting portion 213, it may be guided in the third direction Z, in which the third groove G3 extends.

When the first upper connecting portion 111 is connected to the first lower connecting portion 211, the first upper connecting portion 111 is engaged in the width direction of the first groove G1 of the first lower connecting portion 211, but may move in the first direction X, in which the first groove G1 of the first lower connecting portion 211 extends. When the second upper connecting portion 112 is connected to the second lower connecting portion 212, the second upper connecting portion 112 is engaged in the width direction of the second groove G2 of the second lower connecting portion 212, but may move in the second direction Y, in which the second groove G2 of the second lower connecting portion 212 extends. Similarly, when the third upper connecting portion 113 is connected to the third lower connecting portion 213, the third upper connecting portion 113 is engaged in the width direction of the third groove G3 of the third lower connecting portion 213, but may move in the third direction Z, in which the third groove G3 of the third lower connecting portion 213 extends.

Figure 7:
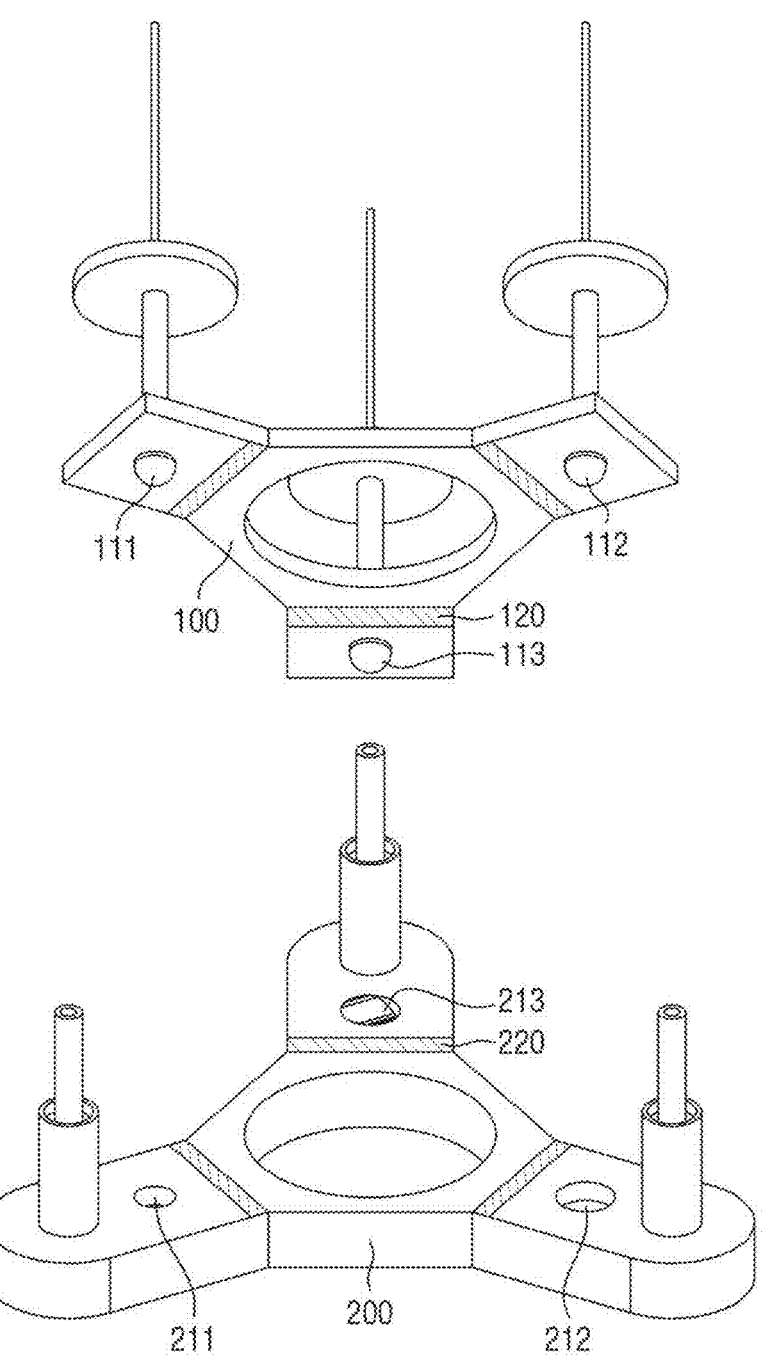
FIGS. 7 and 8 are views for describing an upper connecting portion and a lower connecting portion according to another embodiment of the present disclosure.
Figure 8:
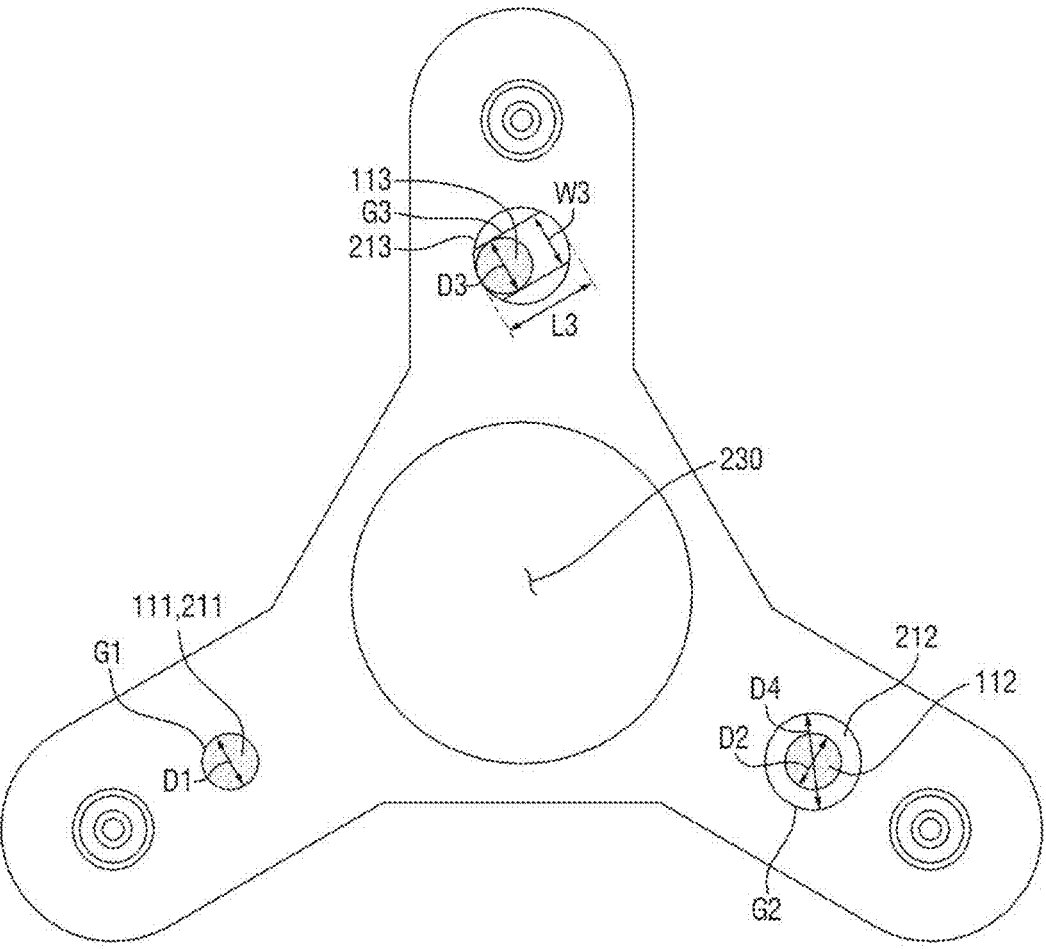

FIGS. 7 and 8 are views for describing an upper connecting portion and a lower connecting portion according to another embodiment of the present disclosure. For convenience of description, the points different from those described with reference to FIGS. 5 and 6 will be mainly described.

Referring to FIGS. 7 and 8, the cross-sectional areas of the first upper connecting portion to the third upper connecting portion 111-113 may be equal to or smaller than the cross-sectional areas of the first lower connecting portion to the third lower connecting portion 211-213.

Specifically, the cross-sectional area of the first upper connecting portion 111 may be the same as that of the first lower connecting portion 211. The first groove G1 of the first lower connecting portion 211 may have a circular shape like a cross-section of the first upper connecting portion 111. In this case, the diameter of the first groove G1 may be the same as the first diameter D1 of the first upper connecting portion 111. Accordingly, when the first upper connecting portion 111 is fitted into the first groove G1 of the first lower connecting portion 211, the first upper connecting portion 111 may be firmly fixed within the first groove G1.

The cross-sectional area of the second upper connecting portion 112 may be smaller than the cross-sectional area of the second lower connecting portion 212. The second groove G2 of the second lower connecting portion 212 may have a larger circular shape than the cross-section of the second upper connecting portion 112. That is, the fourth diameter D4 of the second groove G2 of the second lower connecting portion 212 may be larger than the second diameter D2 of the second upper connecting portion 112. Accordingly, when the second upper connecting portion 112 is fitted into the second groove G2 of the second lower connecting portion 212, the second upper connecting portion 112 is not fixed in any direction inside the second groove G2 of the second lower connecting portion 212, but may move.

The cross-sectional area of the third upper connecting portion 113 may be smaller than the cross-sectional area of the third lower connecting portion 213. The third groove G3 of the third lower connecting portion 213 has a third width W3, and the third groove G3 may extend in a third length L3 in a direction perpendicular to the third width W3. The third width W3 of the third groove G3 may be the same as the third diameter D3 of the third upper connecting portion 113. Accordingly, when the third upper connecting portion 113 is connected to the third lower connecting portion 213, the third upper connecting portion 113 may be fixed in the third width W3 direction inside the third groove G3 of the third lower connecting portion 213.

The third length L3 of the third groove G3 is greater than the third diameter D3 of the third upper connecting portion 213 fitted in the third groove G3. Accordingly, when the third upper connecting portion 113 is fitted into the third lower connecting portion 213, the third upper connecting portion 213 may move in a direction, in which the third groove G3 of the third lower connecting portion 213 extends.

Figure 9:
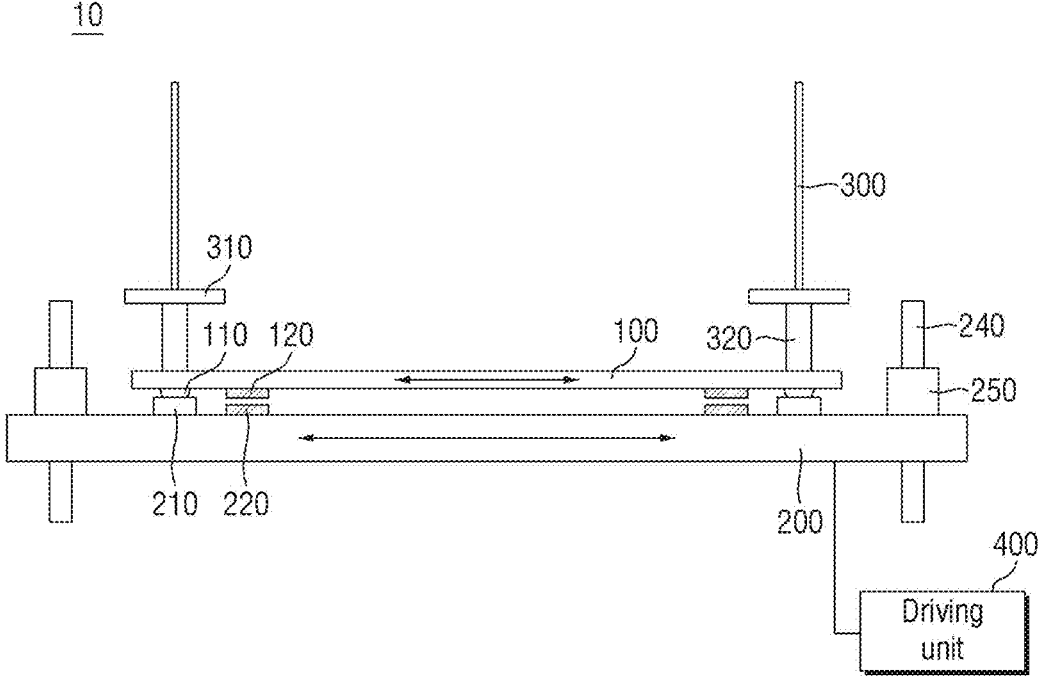
FIG. 9 is a view for describing the thermal expansion coefficient of the upper plate and the lower plate according to an embodiment of the present disclosure.

FIG. 9 is a view for describing the thermal expansion coefficients of the upper plate and the lower plate according to an embodiment of the present disclosure.

Referring to FIG. 9, the upper plate 100 and the lower plate 200 may have different thermal expansion coefficients. Specifically, the thermal expansion coefficient of the upper plate 100 may be lower than that of the lower plate 200. The upper plate 100 and the lower plate 200 may include different materials. The upper plate 100 may include Invar or a ceramic material.

The upper plate 100 and the lower plate 200 may expand due to heat transfer from the electrostatic chuck when the substrate is raised or lowered. In this case, the upper plate 100 having a lower thermal expansion coefficient than the lower plate 200 may expand less than the lower plate 200. On the other hand, the lower plate 200 having a higher thermal expansion coefficient than the upper plate 100 may expand more than the upper plate 100. Accordingly, the movement of the lift pin 300 supported by the upper plate 100 in a direction parallel to the upper plate 100 may be reduced due to thermal expansion of the upper plate 100. In addition, the amount of positional deformation of the lift pin 300 supported by the upper plate 100 due to thermal expansion of the upper plate 100 may be less than the amount of positional deformation of the shaft 240 and the bush 250 supported by the lower plate 200 due to thermal expansion of the lower plate 200.

Figure 10:
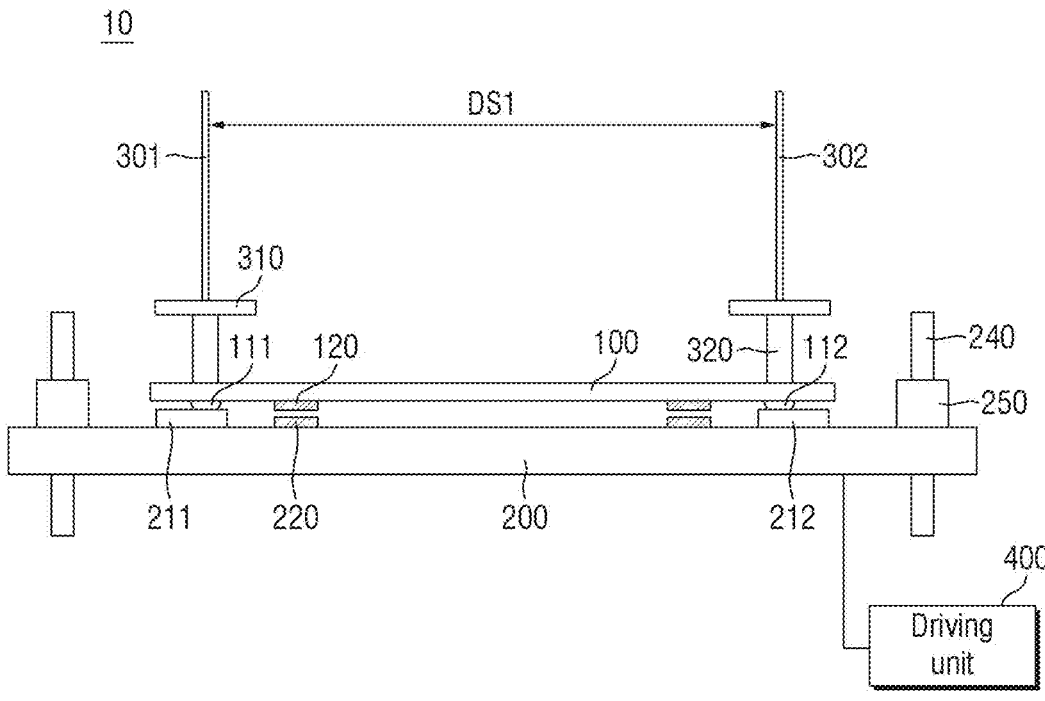
FIGS. 10 and 11 are views for describing the operation of the substrate lifting apparatus according to an embodiment of the present disclosure.
Figure 11:
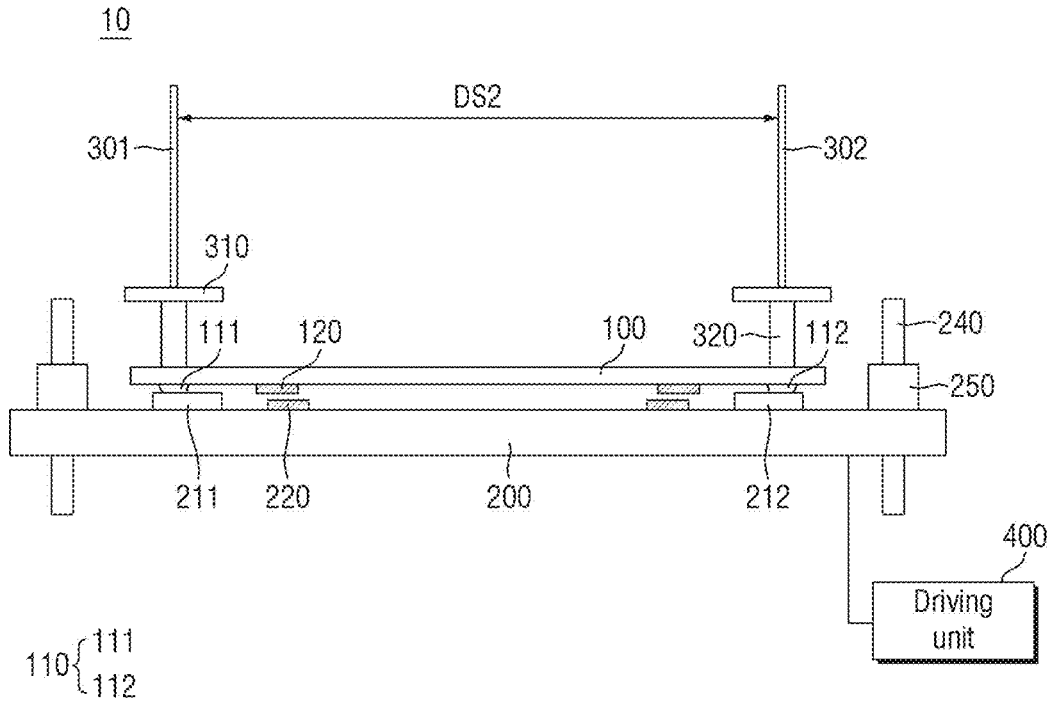

FIGS. 10 and 11 are diagrams for describing the operation of the substrate lifting apparatus according to an embodiment of the present disclosure.

Referring to FIG. 10, when the substrate lifting apparatus 10 is not deformed due to heat, the first upper connecting portion 111 may be located to closest to the lower central hole (230 of FIG. 6) inside the first groove G1 of the first lower connecting portion 211. Similarly, the second upper connecting portion 112 may be located closest to the lower central hole (230 in FIG. 6) inside the second groove G2 of the second lower connecting portion 212. The upper magnet 120 and the lower magnet 220 may completely overlap. In this case, the first lift pin 301 and the second lift pin 302 may be spaced apart from each other by a first distance DS1.

Referring to FIG. 11, when the substrate lifting apparatus 10 expands due to heat, the first upper connecting portion 111 may be located farthest from the lower central hole (230 in FIG. 6) inside the first groove G1 of the first lower connecting portion 211. Similarly, the second upper connecting portion 112 may be located farthest from the lower central hole (230 in FIG. 6) inside the second groove G2 of the second lower connecting portion 212. The upper magnet 120 and the lower magnet 220 may not completely overlap. The position of the upper magnet 120 may be deformed from the upper central hole (130 in FIG. 3) toward the edge direction of the upper plate 100. In this case, the first lift pin 301 and the second lift pin 302 may be spaced apart from each other by a second distance DS2.

Referring to FIGS. 10 and 11, when the substrate lifting apparatus 10 is deformed, such as expansion due to heat, positions of the plurality of lift pins 300 may be deformed. However, since the upper connecting portion 110 and the lower connecting portion 210 are connected, and the upper connecting portion 110 moves along the direction of the groove inside the groove formed in the lower connecting portion 210, the deformation direction may be limited. Accordingly, it is possible to reduce a risk that may occur as the position of the lift pin 300 is deformed.

Figure 12:
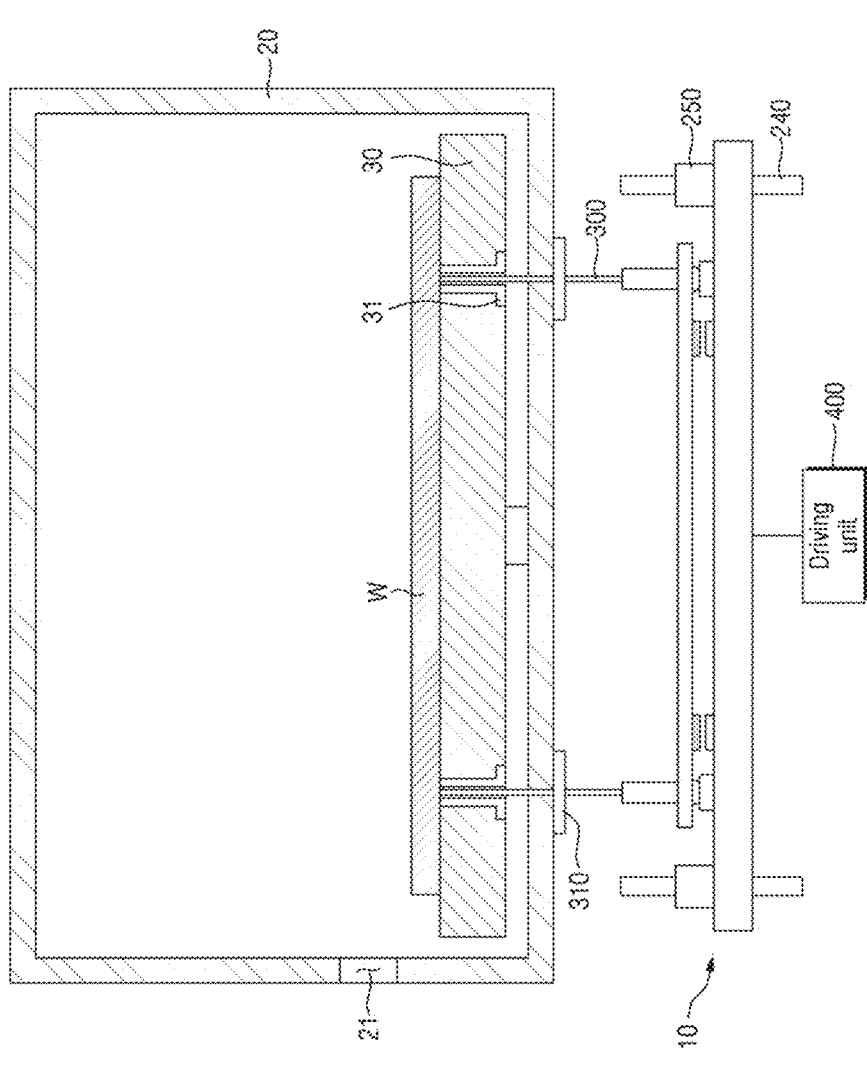
FIGS. 12 and 13 are diagrams for describing an operation of a substrate processing apparatus according to an embodiment of the present disclosure.
Figure 13:
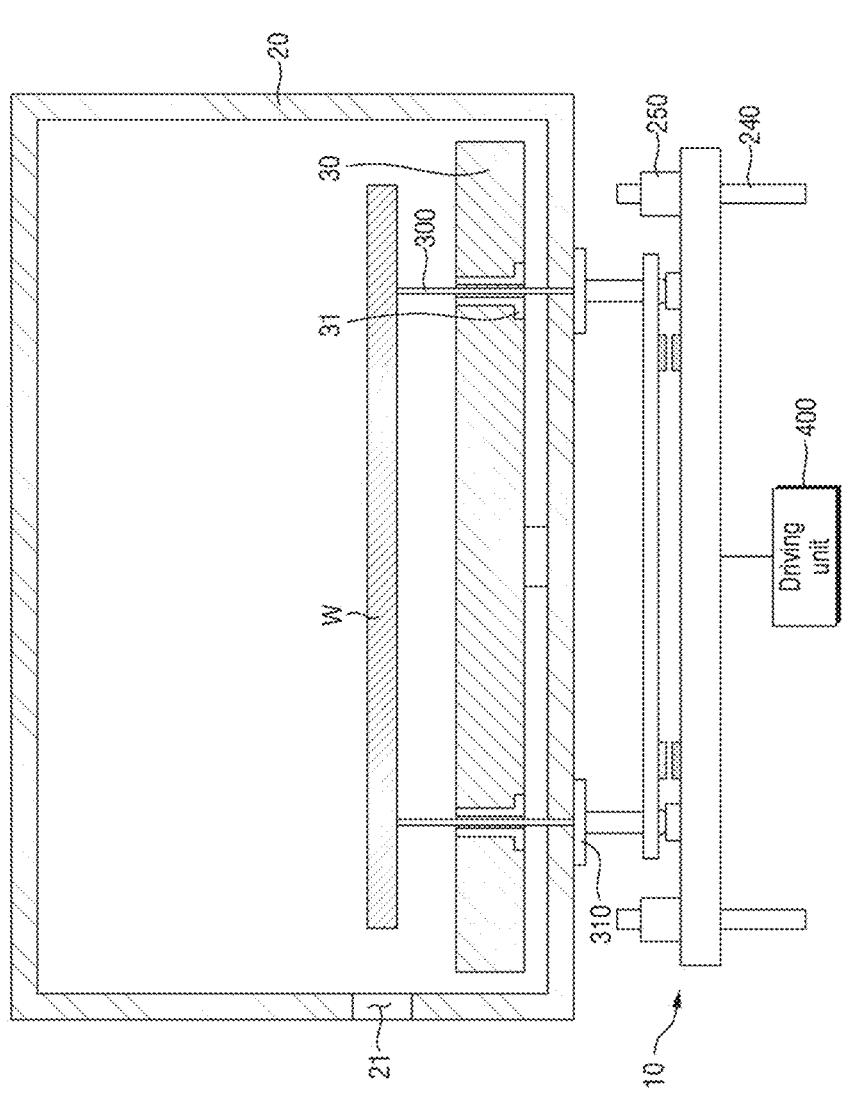

FIGS. 12 and 13 are diagrams for describing an operation of a substrate processing apparatus according to an embodiment of the present disclosure.

Referring to FIG. 12, the substrate processing apparatus 1 includes a substrate lifting apparatus 10, a process chamber 20, and a substrate support unit 30.

The substrate lifting apparatus 10 may raise and lower the substrate W processed in the process chamber 20. The bellows 310 of the substrate lifting apparatus 10 may be disposed on an outer wall of the process chamber 20 through which the lift pins 300 pass. The bellows 310 may isolate the inside and outside of the process chamber 20 so that the inside of the process chamber 20 is maintained in a vacuum. That is, the bellows 310 may seal the process chamber 20.

In FIGS. 12 and 13, the substrate lifting apparatus 10 is disposed outside the process chamber 20 to raise and lower the substrate W, but the embodiment is not limited thereto. For example, the substrate lifting apparatus 10 may raise and lower the substrate W while being disposed under the substrate support unit 30 in the process chamber 20.

The process chamber 20 forms an internal space, in which the substrate W is processed. The process chamber 20 may include a door 21, through which the substrate enters and exits, on a sidewall thereof. The substrate support unit 30 may support the substrate W. The substrate support unit 30 may include an electrostatic chuck. The substrate support unit 30 may include a through portion 31, through which the lift pins 300 pass.

While the substrate W is processed in the process chamber 20, the substrate lifting apparatus 10 may lower the substrate W so that the substrate W is disposed on the substrate support unit 30.

Specifically, the lower plate 200 and the upper plate 100 are lowered as the bush 250 is lowered with respect to the shaft 240 as an axis by the driving unit 400. Accordingly, the lift pin 300 supported by the upper plate 100 is lowered. The lift pin 300 in contact with the substrate W is lowered so as not to protrude upward from the substrate support unit 30, and thus the substrate W is disposed on the substrate support unit 30.

Referring to FIG. 13, the substrate lifting apparatus 10 may lift the substrate W from the substrate support unit 30. Specifically, as the bush 250 is raised and lowered with respect to the shaft 240 as an axis by the driving unit 400, the lower plate 200 and the upper plate 100 are raised and lowered. Accordingly, the lift pin 300 supported by the upper plate 100 is raised and lowered and protrudes upward from the substrate support unit 30. As the lift pin 300 in contact with the substrate W is raised and lowered, the substrate W may be lifted from the substrate support unit 30.

Although embodiments of the present disclosure have been described with reference to the above and the accompanying drawings, those skilled in the art, to which the present disclosure pertains, can understand that the present disclosure may be practiced in other specific forms without changing its technical spirit or essential features. Therefore, it should be understood that the embodiments described above are illustrative in all respects and not limiting.

What is claimed is:

1. An apparatus for lifting a substrate comprising:
   a plurality of pins in contact with a substrate and configured to be movable up or down;
   an upper plate for supporting the plurality of pins and having a plurality of upper connecting portions formed on a lower surface; and
   a lower plate having a plurality of lower connecting portions connected to the plurality of upper connecting portions formed on an upper surface and disposed under the upper plate,
   wherein the lower plate supports a plurality of bushes protruding from the lower plate and a plurality of shafts passing through the plurality of bushes on an upper surface thereof,
   wherein an upper magnet is disposed on the lower surface of the upper plate, and
   wherein a lower magnet is aligned with the upper magnet and disposed on the upper surface of the lower plate.

2. The apparatus of claim 1, wherein a thermal expansion coefficient of the upper plate is lower than a thermal expansion coefficient of the lower plate.

3. The apparatus of claim 1, wherein the plurality of upper connecting portions and the plurality of lower connecting portions are kinematically coupled.

4. The apparatus of claim 1, wherein the plurality of upper connecting portions have a convex shape toward the lower plate,
   wherein at least one of the plurality of lower connecting portions includes a groove, into which the upper connecting portion is inserted, and extending in a direction connecting between a center of the lower plate and the plurality of lower connecting portions.

5. The apparatus of claim 1, wherein the plurality of upper connecting portions, the plurality of lower connecting portions, and the plurality of pins are each three.

6. The apparatus of claim 1, wherein, a hole is formed in a central portion of the upper plate and a central portion of the lower plate.

7. An apparatus for processing a substrate comprising:
   a process chamber defining an inner space;
   a substrate support unit installed in the inner space and for supporting a substrate; and
   a substrate lifting unit for moving the substrate up and down,
   wherein the substrate lifting unit comprises,
   a plurality of pins passing through the substrate support unit, in contact with the substrate, and configured to be movable up or down,
   an upper plate for supporting the plurality of pins and having a plurality of upper connecting portions formed on a lower surface, and
   a lower plate which has a plurality of lower connecting portions formed on an upper surface and connected to the plurality of upper connecting portions and is dis-
posed under the upper plate,
wherein the lower plate supports a plurality of bushes
protruding from the lower plate and a plurality of shafts
passing through the plurality of bushes on an upper
surface thereof,
wherein an upper magnet is disposed on the lower surface
of the upper plate, and
wherein a lower magnet is aligned with the upper magnet
and disposed on the upper surface of the lower plate.
8. The apparatus of claim 7, wherein the plurality of upper
connecting portions have a downwardly convex shape
toward the lower plate,
wherein at least one of the plurality of lower connecting
portions includes a groove, into which the plurality of
upper connecting portions are inserted.
9. The apparatus of claim 8, wherein the groove extends
in a first direction connecting a center of the lower plate and
the plurality of lower connecting portions on the lower plate,
wherein the plurality of upper connecting portions, in
response to connecting to the plurality of lower con-
necting portions, are guided in the first direction and
fixed in a second direction different from the first
direction.
10. The apparatus of claim 7, wherein the substrate lifting
unit further comprises a bellows in contact with an outer
wall of the process chamber and through which the plurality
of pins pass.
11. The apparatus of claim 7, wherein the plurality of
upper connecting portions and the plurality of lower connecting portions overlap the plurality of pins.
12. The apparatus of claim 7, wherein a thermal expansion
coefficient of the upper plate is lower than a thermal expan-
sion coefficient of the lower plate.
13. An apparatus for lifting a substrate comprising:
an upper plate including a plurality of upper connecting
portions disposed on a lower surface;
a plurality of pins disposed on an upper surface of the
upper plate; and
a lower plate disposed under the upper plate,
wherein the lower plate comprises, a plurality of lower connecting portions disposed on an
upper surface of the lower plate and connected to the
plurality of upper connecting portions,
a plurality of bushes protruding from the lower plate,
disposed on an upper surface of the lower plate and
disposed outside the plurality of pins with respect to a
center of the lower plate, and
a plurality of shafts passing through the plurality of
bushes;
wherein the plurality of upper connecting portions include
a convex protrusion toward the plurality of lower
connecting portions,
wherein the plurality of lower connecting portions include
grooves for guiding a movement direction of the pro-
trusion of the plurality of upper connecting portions,
wherein an upper magnet is disposed on the lower surface
of the upper plate, and
wherein a lower magnet is aligned with the upper magnet
and disposed on the upper surface of the lower plate.
14. The apparatus of claim 13,
wherein an attractive force acts between the upper magnet
and the lower magnet.
15. The apparatus of claim 13, wherein:
the plurality of pins are configured to be movable up and
down.
16. The apparatus of claim 13, wherein a thermal expan-
sion coefficient of the upper plate is lower than a thermal
expansion coefficient of the lower plate.
17. The apparatus of claim 13, wherein each of the
plurality of upper connecting portions, the plurality of lower
connecting portions, and the plurality of pins are symmetri-
cal with respect to a center of the lower plate.
18. The apparatus of claim 13, wherein the groove extends
in a first direction along an extension line connecting a
center of the lower plate and the plurality of lower connect-
ing portions, and has a width in a second direction perpen-
dicular to the first direction,
wherein the protrusion is guided in the first direction and
fixed in the second direction.

* * * * *